United States Patent [19]
Chen et al.

[11] Patent Number: 6,159,863
[45] Date of Patent: Dec. 12, 2000

[54] INSITU HARDMASK AND METAL ETCH IN A SINGLE ETCHER

[75] Inventors: Susan Chen, Santa Clara; Judi Quan Rizzuto, Los Gatos; Anne E. Sanderfer, Campbell, all of Calif.

[73] Assignee: Advanced Micro Devices, Inc., Sunnyvale, Calif.

[21] Appl. No.: 09/236,025

[22] Filed: Jan. 22, 1999

[51] Int. Cl.[7] .................................................. H01L 21/00
[52] U.S. Cl. ......................................... 438/720; 438/742
[58] Field of Search ..................................... 438/720, 742, 438/723, 733, 743, 744; 216/67, 75

[56] References Cited

U.S. PATENT DOCUMENTS

| | | | |
|---|---|---|---|
| 5,369,053 | 11/1994 | Fang | 437/194 |
| 5,605,601 | 2/1997 | Kawasaki | 156/643.1 |
| 5,665,641 | 9/1997 | Shen et al. | 438/643 |
| 5,772,903 | 6/1998 | Abraham | 216/72 |
| 5,981,398 | 11/1999 | Tsai et al. | 438/742 X |
| 6,017,826 | 1/2000 | Zhou et al. | 438/734 X |

FOREIGN PATENT DOCUMENTS

| | | |
|---|---|---|
| 0837497A2 | 4/1998 | European Pat. Off. . |
| WO 99/30357 | 9/1999 | WIPO . |

*Primary Examiner*—William Powell
*Attorney, Agent, or Firm*—H. Donald Nelson

[57] ABSTRACT

A method of manufacturing a semiconductor wafer wherein a layer of hardmask material is formed on the surface of a metal layer formed on a layer of interlayer dielectric formed on a semiconductor substrate on and in which active devices have been formed. A layer of photoresist is formed on the surface of the layer of hardmask material, patterned and developed exposing portions of the underlying layer of hardmask material. The semiconductor wafer is placed in an etched and the layer of hardmask material is etched in a first process utilizing a combination fluorine and chlorine chemistry and the metal layer is etched in a second process utilizing a combination fluorine and chlorine chemistry.

7 Claims, 6 Drawing Sheets ial
INSITU HARDMASK AND METAL ETCH IN A SINGLE ETCHER

BACKGROUND OF THE INVENTION

1. Field of the Invention

This invention relates generally to a method of manufacturing high density, high performance semiconductor devices having a hard mask layer formed on the metal stack to prevent DUV resist footings. Even more specifically, this invention relates to a method of manufacturing high density, high performance semiconductor devices using a single etcher to etch the hardmask and metal stack.

2. Discussion of the Related Art

The increased demand for high performance semiconductor devices has required the density of metallization lines to be increased. One of the major demands of end users of high performance semiconductor is an increase in raw processing speed. As more and more transistors have been packed onto the same semiconductor chip such as the microprocessor, the speed and functionality of the semiconductor chip have the potential to be increased significantly. With the increase in the number of transistors, more silicon area is required, however, the transistors need to be closer together to reduce the distance that electrons have to travel from one transistor to another via metal lines. However, as the metal lines have been placed closer together, there is an increased problem caused by reactance between the metal wires. One reactance problem is crosstalk caused by an inductive effect between the interconnections. Another reactance problem is related to an RC delay that is proportional to the operating frequency of the system. Because of the criticality of control of dimensions of structural components of semiconductor devices, any factor that increases or decreases any dimension can cause the performance of the semiconductor device to be less than design specification. The criticality of control is becoming even more critical and will become even more critical as dimensions decrease to the sub-0.25 $\mu$m region.

The accelerated control of critical dimensions at the sub-0.5 $\mu$m region for semiconductor manufacture has increased the interest of the semiconductor industry in anti-reflective coatings to reduce substrate reflectivity to a minimum and to prevent deep-UV resist footings. A paper by Wei W. Lee, Qizhi He, Guoqiang Xing, Abha Singh, Eden Zielinski, Ken Brennan, Girish Dixit, Kelly Taylor, Chien-Sung lian, J D Luttmer and Bob Havemann, entitled *Inorganic ARC for 0.18 $\mu$m and Sub-0.19 $\mu$m Multilevel Metal Interconnects*, discusses the use of $Si_xO_yN_z$ as an anti-reflective coating and also to serve as a hard mask layer. The paper reports the $Si_xO_yN_z$ reduces substrate reflectivity to a minimum and reduces deep-UV resist footing.

However, the use of a layer of a hardmask material such as $Si_xO_yN_z$ requires that the wafer be subjected to two separate etch processes, one to etch the hardmask material and another to etch the metal stack. Each of the separate etch processes requires a different etcher. The use of separate etchers and separate etch processes decreases throughput and adds cost to the process.

FIGS. 1A–1D show a method of manufacturing a semiconductor device without using an $Si_xO_yN_z$ layer. FIG. 1A shows a partially completed portion 100 of a semiconductor device. The partially completed portion 100 of the semiconductor device shows an oxide layer 102 that could be a layer of interlayer dielectric. A barrier layer 104 is formed on the oxide layer 102. The barrier layer could be a layer of Ti/TiN. A metallization layer 106 is formed on the barrier layer 104. The metallization layer 106 is formed from a conductive material such as aluminum. A layer 108 of an anti-reflective coating material is formed on the metallization layer 106. The layer 108 of anti-reflective material is formed from a material such as Ti/TiN.

FIG. 1B shows the partially completed prior art semiconductor device 100 as shown in FIG. 1A with a layer 110 of photoresist formed on the layer 108 of anti-reflective material.

FIG. 1C shows the partially completed prior art semiconductor device 100 as shown in FIG. 1B with the layer 110 of photoresist patterned and etched down to the layer 108 of anti-reflective material. As indicated at 112, structures known as resist footings are formed at the interface between the layer 110 of photoresist and the layer 108 of anti-reflective material. It is theorized that the formation of the resist footings 112 is caused by the nitrogen in the layer 108 of anti-reflective material reacting with the layer 110 of photoresist.

FIG. 1D shows the partially completed prior art semiconductor device 100 as shown in FIG. 1C after a series of etch processes to etch the layer 108, the metal layer 106, and the barrier layer 104 down to the layer 102 of oxide. When the etch processes are completed, it is noted that the resist footings 112 has prevented vertical profiles from being formed in the etched portions. The dimension 114 indicates the desired dimension and the dimension 116 shows the resulting dimension and indicates that the resist footing results in a relatively large reduction from the desired dimension 114. The criticality of the decrease in dimension can be appreciated from the fact that the designed metal line width for a typical process is approximately 0.35 $\mu$m and the spaces between the metal lines are designed to be less than 0.30 $\mu$m. Other processes have similar dimensions and future processes will have smaller dimensions.

FIG. 3 is a flow diagram showing a prior art method of manufacturing wafers. The manufacturing process starts at 300. The manufacturing process includes a series of processes 302 that form active devices in a substrate in the wafer. After the active devices are formed on and in the substrate, an initial layer of interlayer dielectric is formed on the surface of the substrate and a metal layer (stack), indicated at 304, including a hardmask layer is formed on the layer of interlayer dielectric. A layer of photoresist is formed on the hardmask layer, patterned and developed to expose portions of the hardmask layer, indicated at 306, and the wafer is placed in a first etcher to etch the hard mask layer, indicated at 308. After the hardmask layer is etched, the wafer is placed in a second etcher, indicated at 310, to etch the metal layer. After the process in the second etcher is finished, it is determined at 312 if the metal layer just etched is the last metal layer. If it is not, the wafer is further processed at 314 and the next metal layer is formed at 304. This process is continued until it is determined at 312 that the metal layer just completed is the last layer. When the last layer is finished, the wafer is finished 316. The requirement to use two etchers decreases throughput and increases the cost of the process.

Therefore, what is needed is a method of manufacturing a semiconductor device that does not form resist footings that provide non-vertical profiles in etched structures and in addition provides a method that utilizes one etcher to etch both the hardmask layer and the metal layer.

SUMMARY OF THE INVENTION

According to the present invention, the foregoing and other objects and advantages are attained by a method of manufacturing a semiconductor device that prevents the formation of resist footings.

In accordance with an aspect of the invention, a layer of hardmask material is formed on the surface of a metal layer formed on a layer of interlayer dielectric formed on a semiconductor substrate on and in which active devices have been formed. A layer of photoresist is formed on the surface of the layer of hardmask material, patterned and developed exposing portions of the underlying layer of hardmask material. The semiconductor wafer is placed in an etcher and the layer of hardmask material is etched in a first process and the metal layer is etched in a second process.

In accordance with another aspect of the invention, the layer of hardmask material and the metal layer is etched using a process utilizing a combination of a fluorine and chlorine chemistry.

The described method provides a method of manufacturing semiconductor wafers that provides a reduction of resist footings and a method that allows the etching of the hardmask material and the metal layer without changing etchers.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

FIGS. 1A–1D show a prior art method of manufacturing a semiconductor device that forms resist footings; wherein FIG. 1A shows a partially completed portion of a semiconductor device as manufactured in the prior art;

FIG. 1B shows the partially completed portion of the semiconductor device as shown in FIG. 1A with a layer of photoresist formed on the surface of the semiconductor device;

FIG. 1C shows the partially completed portion of the semiconductor device as shown in FIG. 1B with the layer of photoresist patterned and developed showing the formation of resist footings;

FIG. 1D shows the partially completed portion of the semiconductor device as shown in FIG. 1C after a series of etch processes showing the non-vertical etch profiles and reduced dimensions caused by the resist footings;

FIGS. 2A–2D show a method of manufacturing a semiconductor device in accordance with the present invention that prevents the formation of resist footing; wherein FIG. 2A shows a partially completed portion of a semiconductor device as manufactured in accordance with the present invention;

FIG. 2B shows the partially completed portion of the semiconductor device as shown in FIG. 2A with a layer of photoresist formed on the surface of the semiconductor device;

FIG. 2C shows the partially completed portion of the semiconductor device as shown in FIG. 2B with the layer of photoresist patterned and developed showing that resist footings are not formed;

FIG. 2D shows the partially completed portion of the semiconductor device as shown in FIG. 2C after a series of etch processes showing the vertical etch profiles provided by the present invention;

DETAILED DESCRIPTION

Reference is now made in detail to a specific embodiment of the present invention that illustrates the best mode presently contemplated by the inventors for practicing the invention.

Figure 1A:
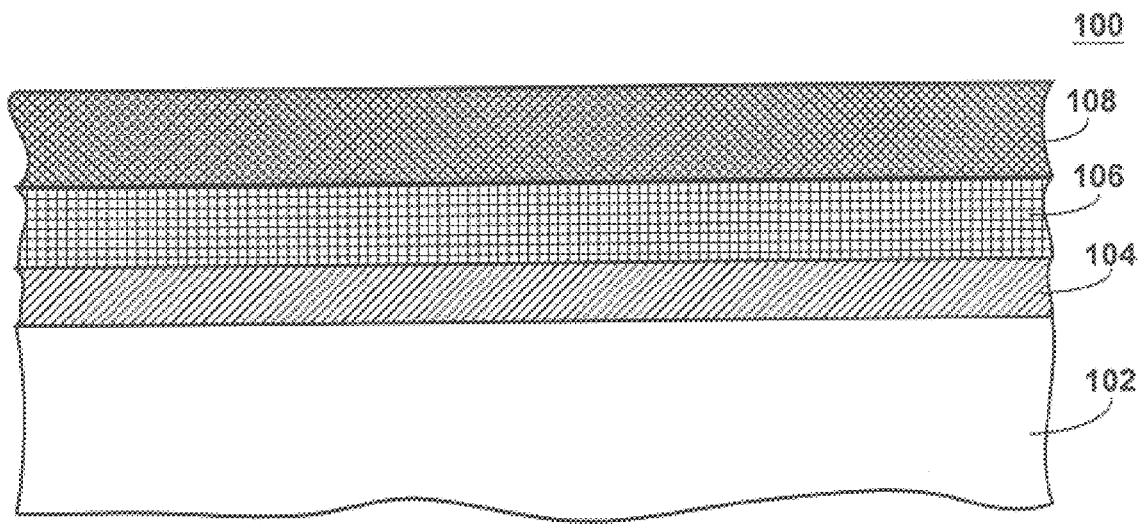
Figure 1B:
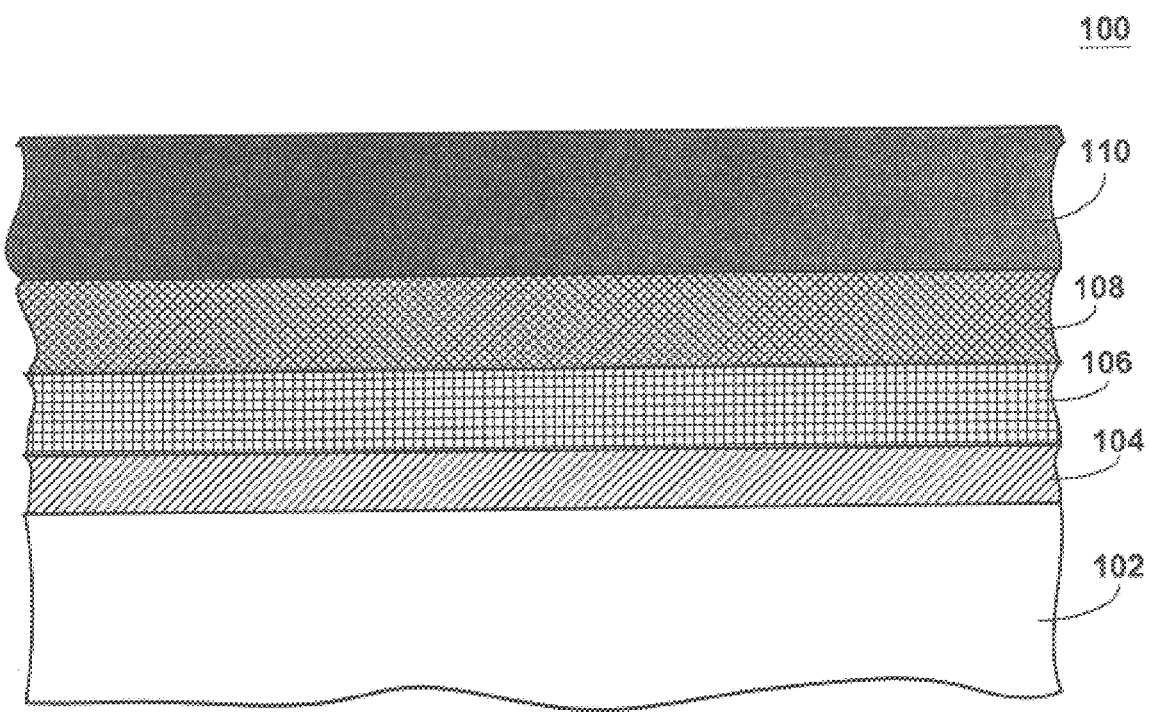
Figure 1C:
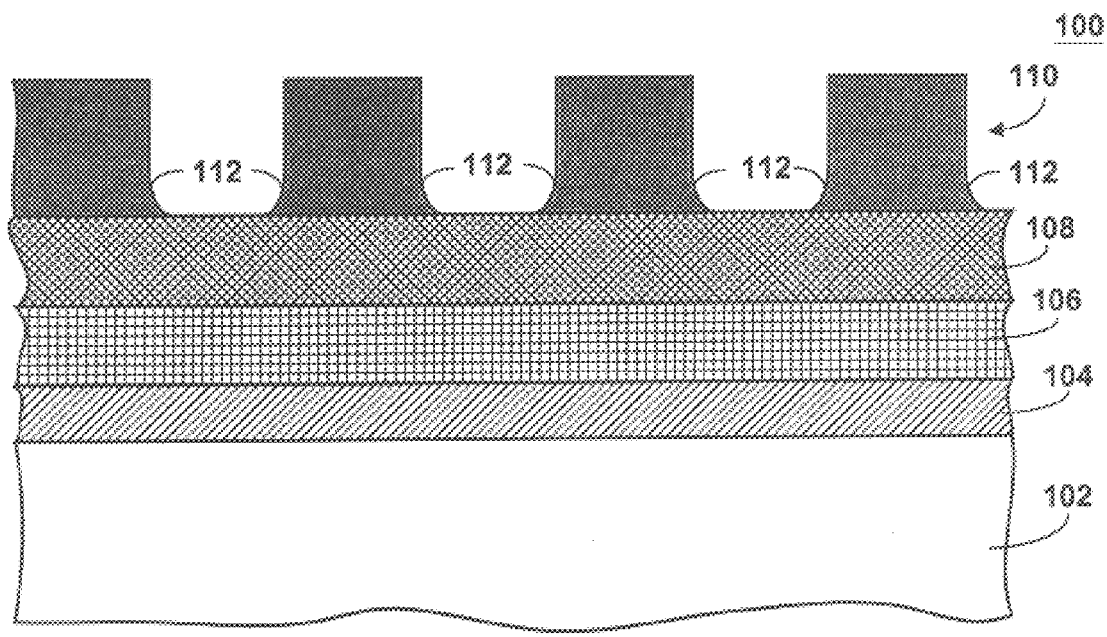
Figure 1D:
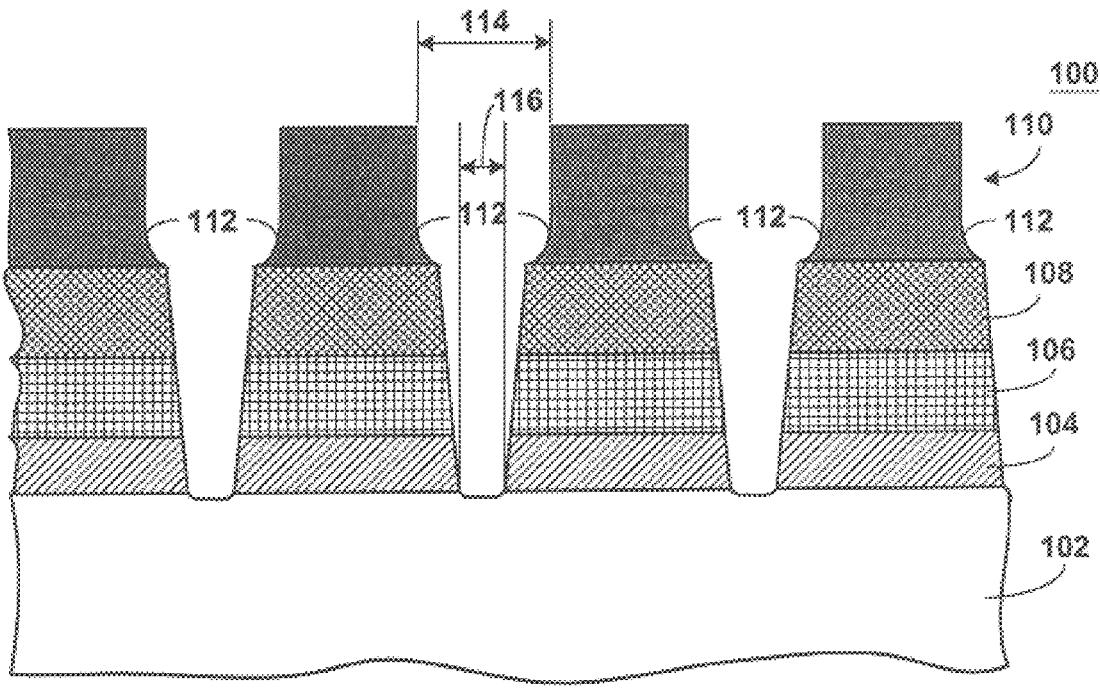
Figure 2A:
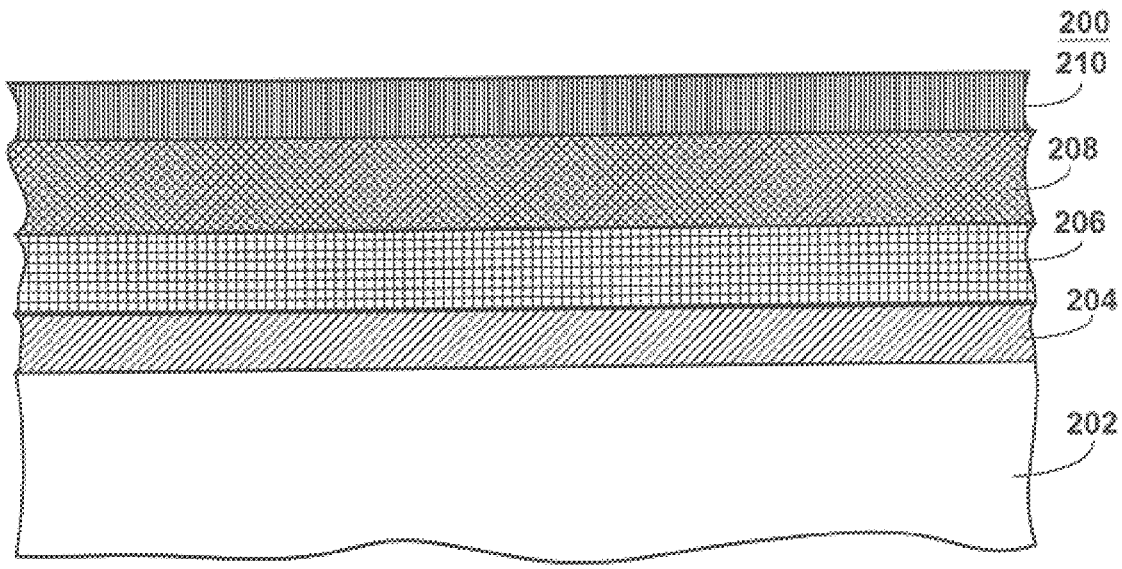

FIGS. 2A–2D show a method of manufacturing a semiconductor device in accordance with the present invention that prevents the formation of resist footing. FIG. 2A shows a partially completed portion of a semiconductor device 200. The partially completed portion 200 of the semiconductor device shows an oxide layer 202 that could be a layer of interlayer dielectric. The oxide layer is typically formed form silicon dioxide ($SiO_2$). A barrier layer 204 is formed on the oxide layer 202. The barrier layer is formed from a material such as Ti/TiN. A metallization layer 206 is formed on the barrier layer 204. The metallization layer 206 is formed of a conductive material such as aluminum. Other materials that could form the metallization layer could be tungsten or doped polysilicon. A layer 208 of an anti-reflective coating material is formed on the metallization layer 206. The layer 208 of anti-reflective material is formed from a material such as Ti/TiN. A hardmask layer 210 is formed on the layer 208 of anti-reflective material. The hardmask layer 210 is formed from a material such as TEOS (tetra-ethyl-ortho-silicate) or treated silicon oxynitride ($Si_xO_yN_z$).

Figure 2B:
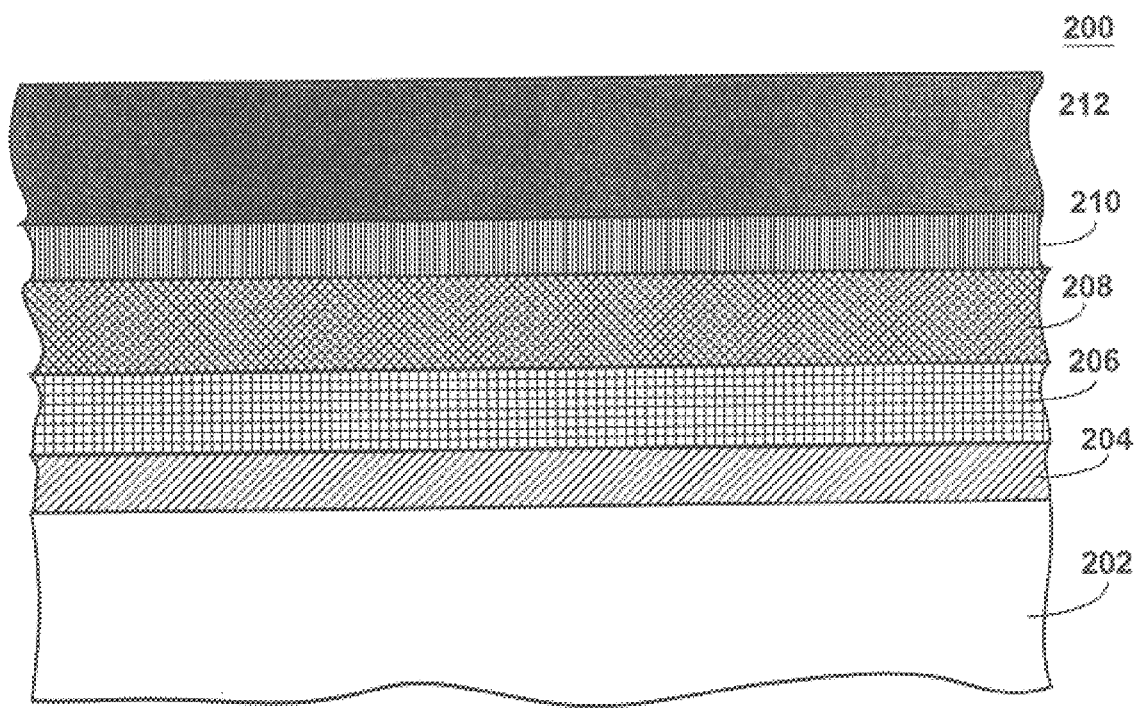

FIG. 2B shows the partially completed semiconductor device 200 as shown in FIG. 2A with a layer of photoresist formed on the hardmask layer 210.

Figure 2C:
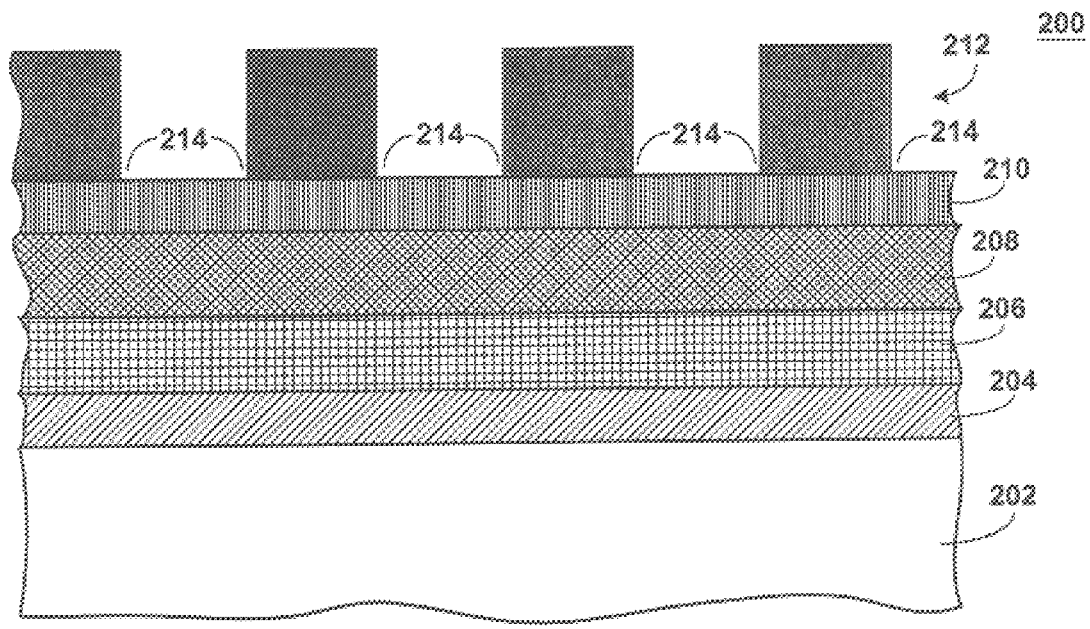

FIG. 2C shows the partially completed semiconductor device 200 as shown in FIG. 2B with the layer 212 of photoresist patterned and developed down to the hardmask layer 210. As indicated at 214, there are no structures formed at the interface between the layer 212 of photoresist and hardmask layer 210.

Figure 2D:
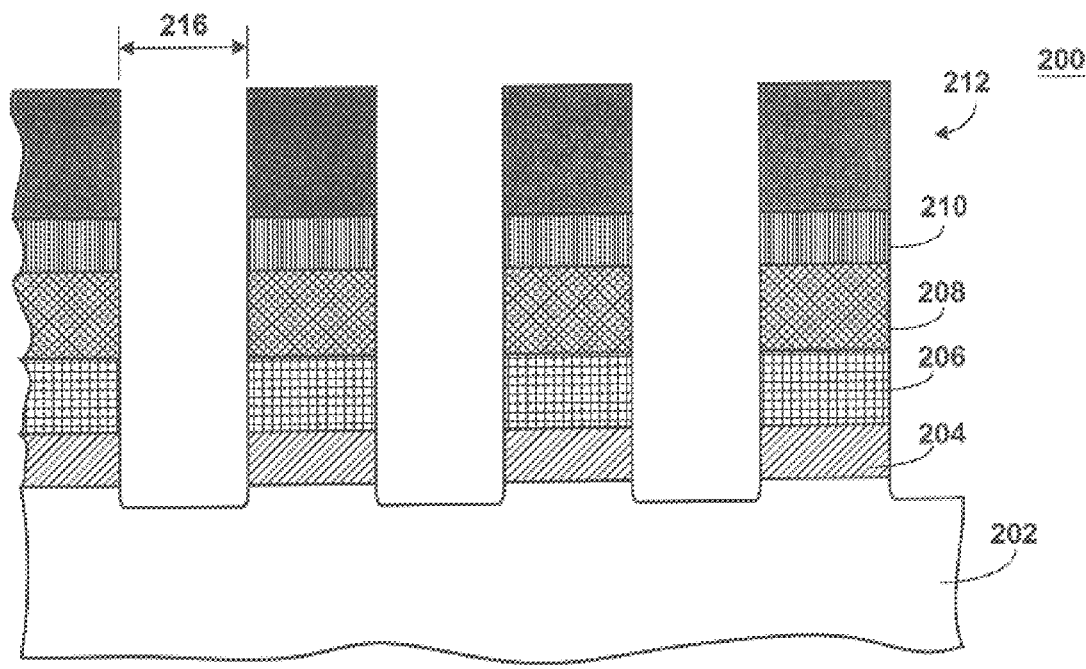
Figure 3:
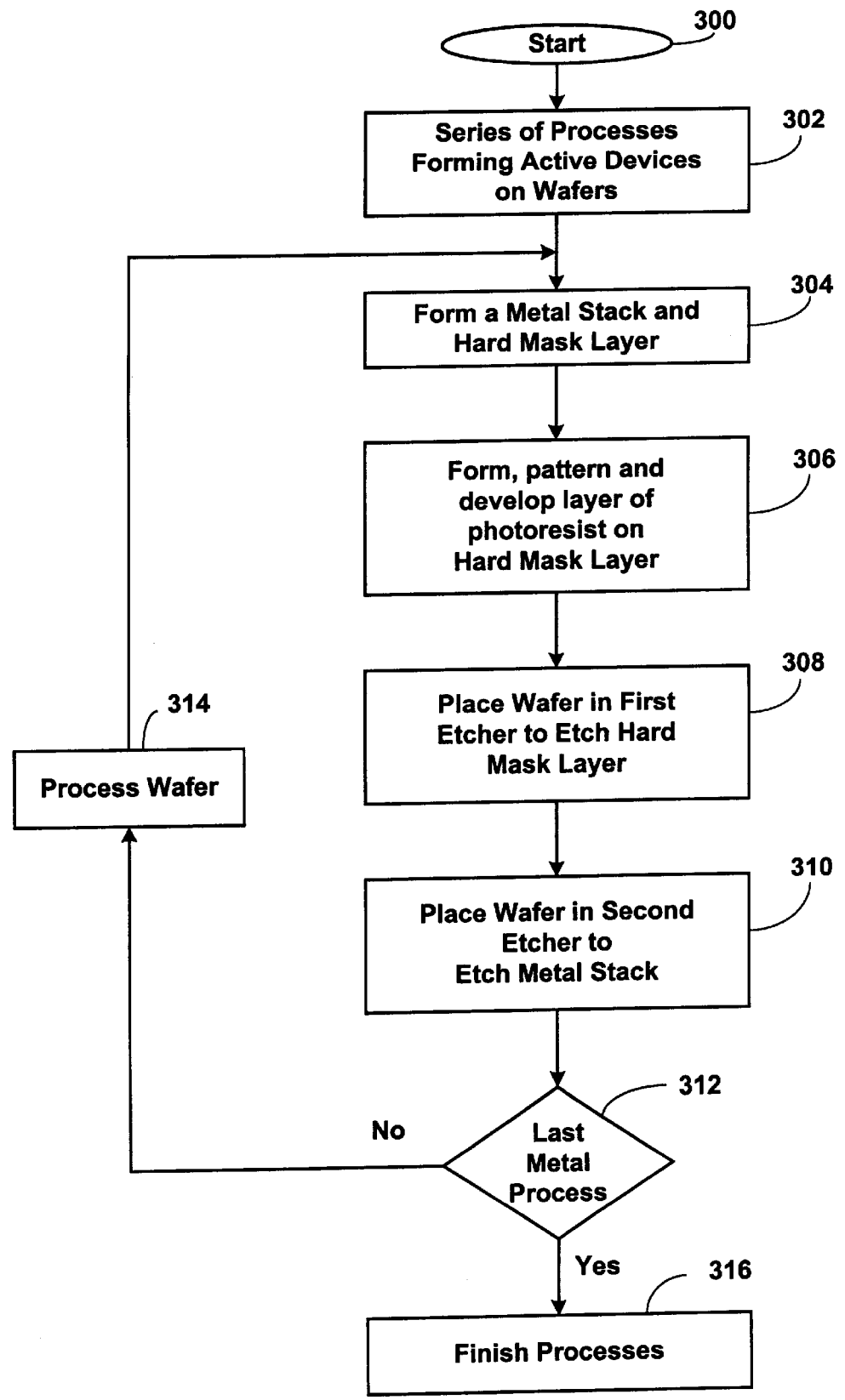
FIG. 3 is a flow diagram showing a prior art method of manufacturing wafers.

FIG. 2D shows the partially completed semiconductor device 200 as shown in FIG. 2C after a series of etch processes to etch the hardmask layer 210, the layer 208 of anti-reflective coating material, the metal layer 206, and the barrier layer 204 down to the layer 202 of oxide. When the etch processes are completed it is noted that the desired width of the etched portion, indicated at 316, has not been reduced. The hard mask layer 210 and the metal layer 206 are etched in the same etched using similar chemistry to save process steps and process time. The hard mask layer 210 and the metal layer 206 including the Ti/TiN layer are etched using a combination fluorine and chlorine etch chemistry.

Figure 4:
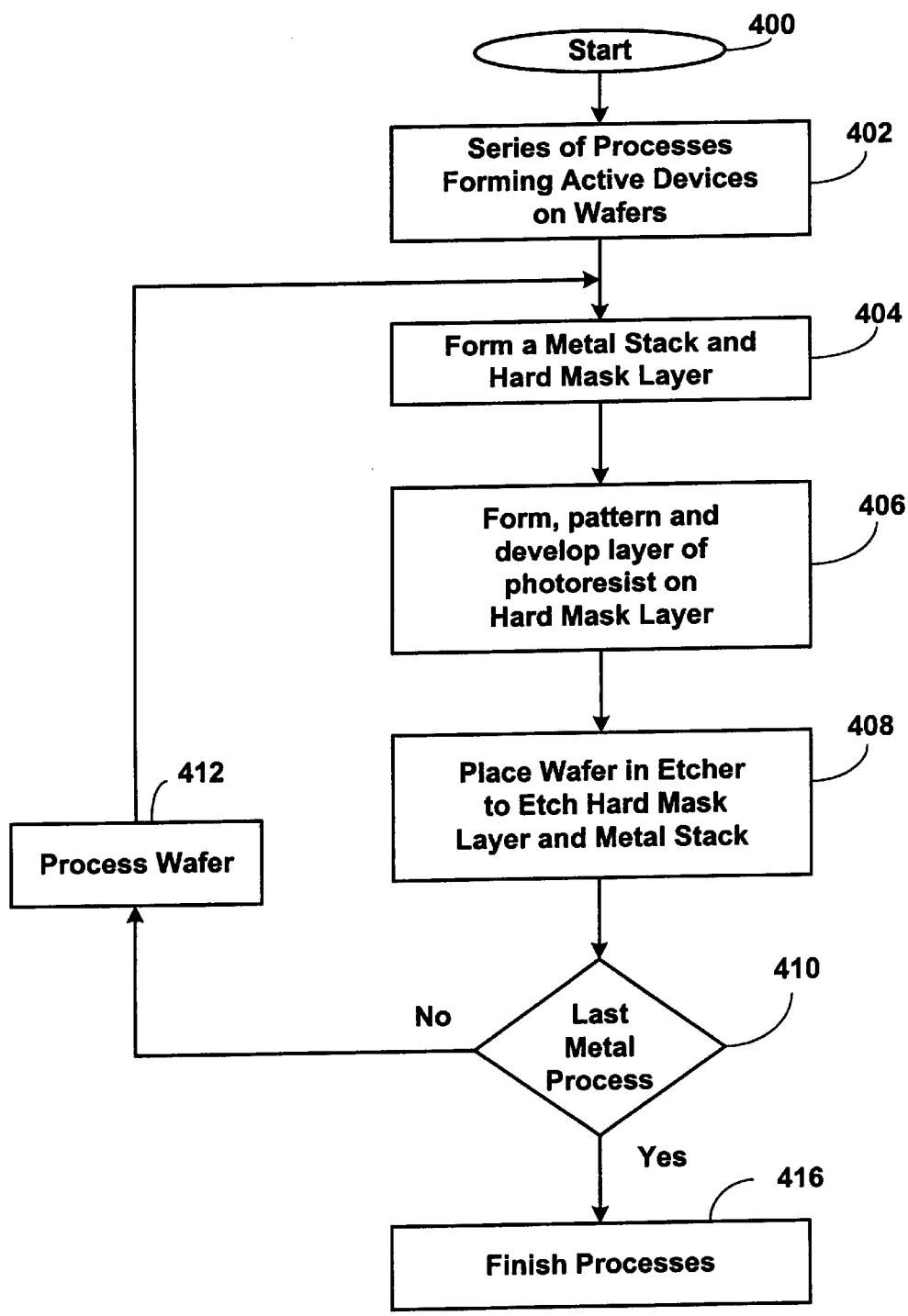
FIG. 4 is a flow diagram showing a method of manufacturing wafers in accordance with the present invention.

FIG. 4 is a flow diagram showing a method of manufacturing wafers in accordance with the present invention. The manufacturing process starts at 400. The manufacturing process includes a series of processes, indicated at 402, that form active devices in a substrate in the wafer. After the active devices are formed on and in the substrate, an initial layer of interlayer dielectric is formed on the surface of the substrate and a metal layer (stack), indicated at 404, including a hardmask layer is formed on the layer of interlayer dielectric. A layer of photoresist is formed on the hardmask layer, patterned and developed to expose portions of the hardmask layer, indicated at 406, and the wafer is placed in an etcher, indicated at 408, to etch the hardmask layer and the metal layer. The hardmask layer and the metal layer are etched using a combination fluorine and chlorine etch chemistry.

In summary, the results and advantages of the method of the present invention can now be more fully realized. The described method provides a method of manufacturing a semiconductor device that prevents the formation of deep-UV resist footings that cause an undesired reduction in critical dimensions during subsequent etch processes in prior art semiconductor devices. In addition, the described method provides a method of manufacturing a semiconductor device that allows a single etcher to etch the hardmask layer and the metal layer.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a semiconductor wafer, the method comprising:

forming active devices in and on a substrate in the semiconductor wafer;

forming an interlayer dielectric on a surface of the semiconductor wafer;

forming a metal layer on the surface of the interlayer dielectric;

forming a layer of hardmask material on the surface of the metal layer;

forming a layer of photoresist on the layer of hardmask material;

patterning and developing the layer of photoresist exposing portions of the hardmask material underlying the layer of photoresist;

placing the semiconductor wafer in an etcher;

etching the exposed portions of the layer of hardmask material exposing portions of the metal layer underlying the layer of hardmask material; and without removing the semiconductor wafer from the etcher etching the exposed portions of the metal layer.

2. The method of claim 1 wherein etching the exposed portions of the layer of hardmask material is accomplished by an etching process utilizing a combination fluorine and chlorine chemistry.

3. The method of claim 2 wherein etching the exposed portions of the exposed portions of the metal layer is accomplished by an etching process utilizing a combination fluorine and chlorine chemistry.

4. The method of claim 3 further comprising determining if the etched metal layer is the last metal layer.

5. The method of claim 4 further comprising further processing the wafer if the metal layer is not the last metal layer.

6. The method of claim 4 further comprising finishing the wafer if the metal layer is the last metal layer.

7. The method of claim 1 wherein the step of forming a layer of hardmask material is accomplished by selecting the hardmask material from the group consisting of TEOS and silicon oxynitride.

* * * * *